(12) United States Patent
Tsutsui et al.

(10) Patent No.: US 6,395,572 B1
(45) Date of Patent: May 28, 2002

(54) METHOD OF PRODUCING SEMICONDUCTOR LIGHT-EMITTING ELEMENT

(75) Inventors: Tsuyoshi Tsutsui; Kotaro Ogura, both of Kyoto (JP)

(73) Assignee: ROHM Co, Ltd., Kyoto (JP)

( * ) Notice: Subject to any disclaimer, the term of this patent is extended or adjusted under 35 U.S.C. 154(b) by 0 days.

(21) Appl. No.: 09/518,504

(22) Filed: Mar. 3, 2000

(30) Foreign Application Priority Data

Apr. 15, 1999 (JP) .......................................... 11-108171

(51) Int. Cl.$^7$ .............................................. H01L 21/00
(52) U.S. Cl. ............................ 438/46; 438/22; 438/745
(58) Field of Search ............................. 438/22, 46, 745

(56) References Cited

U.S. PATENT DOCUMENTS 4,914,499 A * 4/1990 Homoto 5,488,253 A * 1/1996 Matsuoka .................... 257/622

* cited by examiner

*Primary Examiner*—Long Pham
(74) *Attorney, Agent, or Firm*—Beyer Weaver & Thomas, LLP

(57) ABSTRACT

Semiconductor light-emitting elements are produced by providing a wafer substrate of GaP, epitaxially growing on this substrate a semiconductor layered structure including an n-type layer and a p-type layer of GaP for providing a light-emitting layer, forming top electrodes on the semiconductor layered structure each over a portion of the area corresponding to one of the chips into which the substrate is to be later divided, forming a bottom electrode on the bottom surface of the substrate, dicing the wafer substrate into the individual chips, and thereafter carrying out a surface-roughening process on externally exposed portions of the semiconductor structure by means of hydrochloric acid. Each of the top electrodes is of a three-layer structure with a contact metal layer which may be of an alloy of Au and makes an ohmic contact with the GaP of the semiconductor layered structure, a Mo layer on the contact metal layer and an Au layer on the Mo layer.

18 Claims, 1 Drawing Sheet

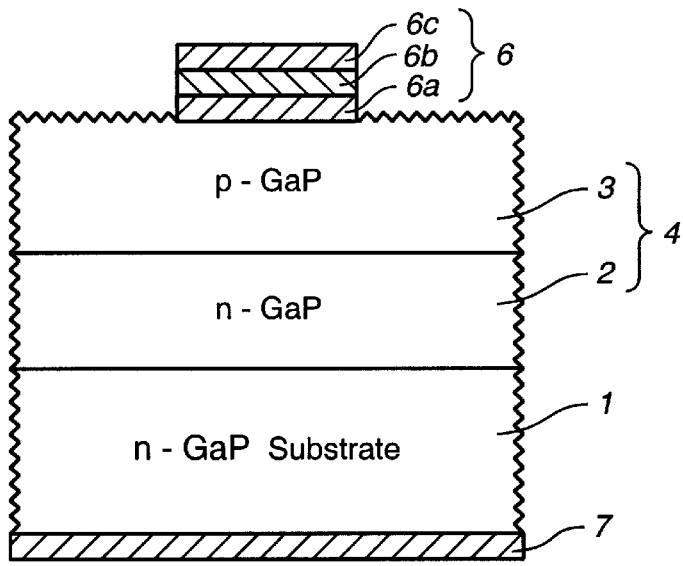
FIG._1
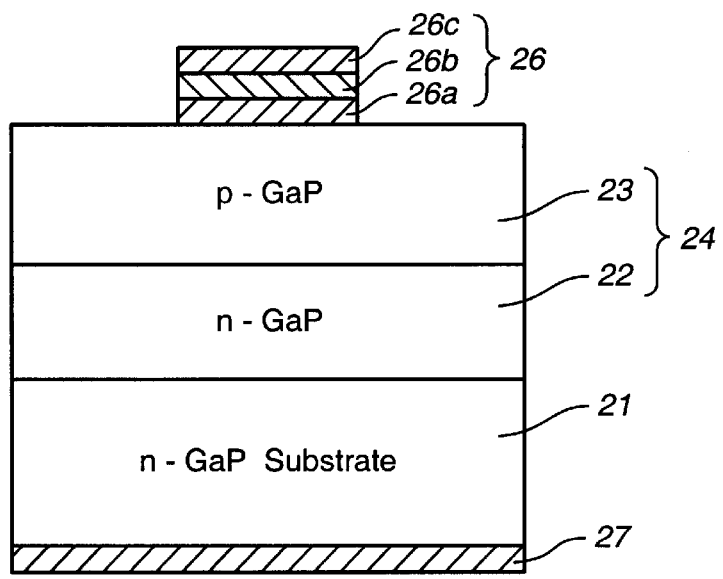
FIG._2
(PRIOR ART)

METHOD OF PRODUCING SEMICONDUCTOR LIGHT-EMITTING ELEMENT

BACKGROUND OF THE INVENTION

This invention relates to a method of producing semiconductor green light-emitting elements comprising a semiconductive GaP compound. In particular, this invention relates to a method of producing such semiconductor light-emitting elements including a surface-roughening process by a wet etching method using hydrochloric acid so as to improve the external differential quantum efficiency while preventing the electrodes from being affected by the processing liquid and maintaining good characteristics regarding ohmic contact and wire bonding on the electrode.

FIG. 2 shows a prior art semiconductor light-emitting element having an n-type GaP layer 22 and a p-type GaP layer 23 epitaxially grown on a substrate 21 of n-type GaP and having a light-emitting part formed as a pn junction therebetween. A top electrode ("p-layer electrode") 26 comprising an Au-Be alloy layer 26a, a Ti layer 26b and an Au layer 26c is formed over a portion of the top surface and a bottom electrode ("n-layer electrode") 27 is formed as an Au-Be alloy layer on the bottom surface. Each such element is obtained as a chip from a wafer. The reason for forming the top electrode 26 over only a portion of the top surface is that the electrode screens off light while it is desirable to design the element such that as much light as possible can be received therefrom. Thus, the top electrode 26 is made to occupy as small an area as possible within a limit that the electric current therethrough can spread across the entire sectional area of the chip. The reason for using a three-layer structure as the top electrode 26 is that the Au-Be alloy layer 26a is required to improve the ohmic contact with the GaP layer, the Ti layer 26b in the middle is required to serve as a barrier layer for preventing diffusion of Ga because its deposition on the surface of the electrode would have an adverse effect on the adhesive force of wire bonding and the Au layer 26c is required for an improved contact with a gold wire which is attached to the electrode by wire bonding.

After it is formed as a chip, the exposed surfaces of the semiconductor layer is subjected to a roughening process by using hydrochloric acid, for example, to produce protrusions and indentations so as to improve the external differential quantum efficiency by which light is taken outside. It has been known in particular to carry out such a surface treatment by a wet etching process with hydrochloric acid for improving the external differential quantum efficiency.

Thus, according to the prior art technology for the production of a semiconductor light-emitting element by growing GaP layers on a GaP substrate and roughing the exposed surfaces of the semiconductor layer after it is made into the form of a chip, the wet etching process for roughening the exposed surfaces is carried out after the electrodes are formed on the top of the semiconductor layered part and the bottom of the substrate. This is firstly because the roughening process be done only after the dicing process for producing a chip, secondly because the electrodes can be formed more efficiently on a wafer, and also because if the electrodes are formed after a roughening process is effected over all surfaces of a wafer, the electrodes become hard to recognize at the time of wire bonding and this affects the wire bonding characteristics adversely and/or the resistance across the contact surfaces becomes large.

If roughening process by wet etching is carried out after the formation of the electrodes, on the other hand, the electrodes which have been formed are also dipped in the etching liquid. If hydrochloric acid is used for the roughening process for the production of the element described, above, for example, the Ti layer 26b which is the middle layer of the electrode of the three-layer structure is invaded by it. In order to prevent this undesired effect, the Ti layer 26b must be made extremely thin so as not to become etched away. If it is made too thin, however, it cannot act sufficiently effectively as a barrier layer, adversely affecting the resultant wire bonding characteristic.

The reason for roughening the exposed surfaces of the semiconductor layers is to prevent the light generated at the light-emitting layer from undergoing total reflections inside the chip and to become absorbed internally and to thereby make it easier to escape outside. The reflectivity at the surfaces changes, depending on the depth of the unevenness, and the external differential quantum efficiency is greatly influenced thereby. Thus, if a liquid which will not etch the materials of the electrode is used for the roughening process, a desired level of unevenness cannot be obtained on the exposed surfaces of the semiconductor layers and hence the external differential quantum efficiency cannot be sufficiently improved.

SUMMARY OF THE INVENTION

It is therefore an object of this invention to provide a method of producing semiconductor light-emitting elements by which electrodes with a good ohmic contact and improved wire bonding characteristics can be formed by preventing the diffusion of Ga onto the electrode surface while carrying out a roughening process to produce sufficient unevenness with protrusions and indentations around the light-emitting element chip.

A method embodying this invention, with which the above and other objects can be accomplished, may be characterized as comprising the steps of providing a wafer substrate comprising GaP, epitaxially growing thereon a semiconductor layered structure including an ntype layer and a p-type layer comprising GaP for providing a light-emitting layer, forming top electrodes on the semiconductor layered structure each over a portion of an area corresponding to one of the chips into which the substrate is to be later divided, forming a bottom electrode on the bottom surface of the substrate, dicing the wafer substrate into the individual chips, and thereafter carrying out a surface-roughening process on externally exposed portions of the semiconductor layered structure by means of hydrochloric acid. Each of the top electrodes is of a three-layer structure with a contact metal layer which makes an ohmic contact with the GaP of the semiconductor layered structure, a Mo layer on the contact metal layer and an Au layer on the Mo layer. In the above, the surface-roughening process is carried out such that a surface-roughness of about 0.1–3 $\mu$m will result in terms of the height difference between the resulting protrusions and indentations. The contact metal layer may be made of one or more alloys of Au with Be, Zn and Ni such that none of the materials for the top electrode is affected by the hydrochloric acid which is used in the wet etching process for the surface roughening.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1 is a sectional view of a semiconductor light-emitting element in a chip form, or an LED chip, produced by a method embodying this invention; and FIG. 2 is a sectional view of a prior art semiconductor LED chip.

DETAILED DESCRIPTION OF THE INVENTION

The invention is described next with reference to FIG. 1 which shows a semiconductor light-emitting element in a chip form (hereinafter referred to as an LED chip) which may be produced by a method embodying this invention. To produce such an LED chip, an n-type layer 2 and a p-type layer 3 of GaP, together forming what is hereinafter referred to as the semiconductor layered structure 4, are sequentially formed epitaxially on a semiconductor GaP substrate 1. In order to make these epitaxially grown layers 2 and 3 relatively thick, say, with a thickness of about 10–100 μm so as to improve the efficiency with which the generated light can be taken out of this semiconductor layered structure 4, as well as to obtain layers with improved crystallinity, it is preferable to form these layers 2 and 3 by a method of liquid-phase epitaxy.

Top electrodes 6 (only one of which is shown in FIG. 1) are formed on the top surface of this semiconductor layered structure 4 such that each top electrode 6 occupies a small portion of the top surface area corresponding to each of the chips into which the semiconductor layered structure 4 now in a wafer form is divided. A bottom electrode 7 is formed over the bottom surface of the semiconductor substrate 1 and then the wafer is diced into the chips. Thereafter, the exposed surfaces of the semiconductor layered structure 4 are subjected to a roughening process by using hydrochloric acid. The present invention is characterized both wherein the top electrode 6 is formed in a three-layer form including a contact metal layer 6a for making an ohmic contact with the p-type GaP layer 3, an intermediate Mo layer 6b and a top Au layer 6c and wherein hydrochloric acid is used in the roughening process.

For forming the semiconductor layered structure 4 which provides light-emitting GaP layers on the substrate 1 of GaP by liquid epitaxy, the temperature of the boat for melted n-type liquid G obtained by melting GaP doped with an n-type dopant is maintained at a temperature level of about 900–1000° C. and the temperature of the liquid G is gradually lowered while contacting a surface of the GaP substrate 1 so as to epitaxially grow the n-type GaP layer 2 on the substrate 1. When a thickness of about 60–80 μm is reached (or when the temperature for the growth reaches about 700–800° C.), for example, the growth is continued while allowing Zn (a p-type dopant) to evaporate to continue doping and the temperature is further lowered gradually so as to grow the p-type GaP layer 3 to the thickness of about 20–30 μm. For improving the efficiency of light emission, it is preferable to grow the n-type layer 2 and the p-type layer 3 such that their carrier densities will be about $5 \times 10^{17} - 5 \times 10^{18}$ cm$^{-3}$.

Although an example with a semiconductor layered structure 4 with a relatively simple junction structure with an n-type GaP layer 2 and a p-type GaP layer 3 was described above, different layered structures of other kinds may be used such as by stacking an n$^+$ layer, an n$^-$ layer and a p-type layer or using a hetero junction.

After the semiconductor layered structure 4 is thus formed epitaxially, the bottom surface of the GaP substrate 1 is polished by a chemical mechanical polish (CMP) method such that the LED chip will have a specified total thickness, say, of 200–300 μm. This polishing process may be dispensed with if the LED chip is not required to be made thin but it is generally preferable to reduce the thickness of the substrate 1 because this GaP substrate 1 does not have a good crystalline characteristic and causes attenuation of light. If this substrate 1 is made thinner, this means that the semiconductor layered structure 4 epitaxially formed thereon becomes relatively thick and the light generated inside repeats many internal reflections and can be effectively taken outside.

The top electrode 6 is formed thereafter, for example, by a process of vacuum vapor deposition. As explained above, this top electrode 6 is of a three-layer structure including a contact metal layer 6a, a Mo layer 6b and an Au layer 6c. The contact metal layer 6a is of thickness about 500–3000 Å and comprises one of more of alloys of Au with Be, Zn or Ni such as Au—Be alloy, Au—Be—Ni alloy, Au—Zn alloy and Au—Ni alloy. It is to be noted in particular that the electrode is free of Ti which will dissolve when treated with hydrochloric acid. The Mo layer 6b is to serve as a barrier layer for preventing Ga from diffusing from the GaP layer to become deposited on the surface. Mo is selected as the material for this layer according to this invention not because it can serve as such a barrier but also it is not affected by hydrochloric acid used in the surface-roughening process which is to follow. The Mo layer 6b is formed as a membrane with a thickness of about 100–3000 Å so as to fraction sufficiently well as the barrier. The Au layer 6c is preferred because Au is a material with high affinity with a wire which is adapted to be bonded to its surface, say, by a wire bonding process. Au is a preferred material also because it is strong against hydrochloric acid used in the surface-roughening process. It is formed to a thickness of about 2000–12000 Å.

Since the light generated inside the semiconductor layered structure 4 is taken out through its top surface, the top electrode 6 is formed so as to prevent as little light as possible from being taken out as long as it is large enough such that the electric current therethrough will spread throughout the chip and can produce light with a high efficiency. Methods for forming the top electrode 6 over such a limited area on the top surface of the semiconductor layered structure 4 include the so-called lift-off method by which a resist mask is provided all over the top surface except the portion where the top electrode 6 is to be formed by vacuum deposition, as well as the mask vapor deposition method whereby the portion of the top surface not for forming the top electrode 6 is covered with a glass mask such that the material for the electrode is deposited only over a desired area. These methods are preferable to the method of forming three layers of different metals all over and then etching them to form the electrode because it is complicated and troublesome to etch the layers of three different metals.

After the bottom electrode 7 is formed on the bottom surface of the GaP substrate 1 by applying an electrode-forming metal comprising an Au—Ge alloy all over, individual chips are obtained by dicing.

Next, the chips thus obtained by dicing are dipped in a HCl solution with concentration 10–35 weight % for 0.5–5 minutes in order to form protrusions and indentations on the exposed chip surfaces as shown in FIG. 1. The surface roughness, as measured in terms of the difference in height between the protrusions and the indentations, should preferably be about 0.1–3 μm, or more preferably about 1–2 μm for the purpose of taking out light through the top surface because the portion of light making incidence on side surfaces can be reflected towards the top surface from which it can be taken out. A solution of hydrochloric acid with concentration within such a range is most suited for obtaining the surface roughness in the desired range. The control of the surface roughness becomes difficult if the concentration of the hydrochloric acid is larger or smaller than this range. If the surface roughening is carried out with hydrofluoric acid of sulfuric acid, the surface roughness is insufficient and a desirable result cannot be obtained. It is to be noted that the metals which are used to form the electrodes are so selected that they are not affected by hydrochloric acid. In other words, the kind of liquid for the surface-roughening process and the metallic materials for the electrodes are so selected that a desired level of surface roughness can be obtained while the electrode metals are not affected by the liquid used in the surface-roughing process.

In summary, the surface-roughening process on the externally exposed surfaces of the semiconductor layered structure 4 comprising GaP is carried out after the electrodes are formed. The electrode surfaces are thus free of unevenness and the wire bonding on them can be carried out more efficiently. Moreover, total internal reflection of light on the chip surface and side walls can be limited such that a larger portion of light can be taken out. This means that semiconductor light-emitting elements with improved brightness with an improved external differential quantum efficiency can be obtained according to this invention. The roughening process is carried out by using hydrochloric acid while Mo is not thereby affected at all and not etched although it is exposed externally over the side surfaces of the top electrode. Thus, the Mo layer can be made with a thickness in the range of 100–3000 Å at which it can efficiently serve as a barrier layer, serving to completely prevent the diffusion of Ga. Neither is the contact metal layer of an Au-containing alloy affected by hydrochloric acid while providing a good ohmic characteristic with the GaP layer.

What is claimed is:

1. A method of producing semiconductor light-emitting elements, said method comprising the steps of:

providing a wafer substrate comprising GaP, having a top surface and a bottom surface;

epitaxially growing on said top surface of said substrated semiconductor layered structure including an n-layer and a p-type layer comprising GaP, said n-type layer and said p-type layer forming a light-emitting layer;

forming top electrodes on said semiconductor layered structure each over a portion of an area corresponding to one of chips into which said substrate is to be later divided, each of said top electrodes being free of Ti and of a three-layer structure consisting of a contact metal layer which makes an ohmic contact with the GaP of said semiconductor layered structure, a Mo layer on said contact metal layer and an Au layer on said Mo layer;

forming a bottom electrode on said bottom surface of said substrate;

dicing said wafer substrate into said chips; and thereafter carrying out a surface-roughening process on externally exposed portions of said semiconductor layered structure by means of hydrochloric acid.

2. The method of claim 1 wherein said surface-roughening process is carried out to obtain surface roughness of 0.1–3 μm in terms of height difference between protrusions and indentations on said externally exposed portions.

3. The method of claim 1 wherein said top electrodes are formed by vacuum vapor deposition.

4. The method of claim 1 wherein said Mo layer is formed to a thickness of 100–3000 Å.

5. The method of claim 1 wherein said contact metal layer comprises an alloy of Au, having a thickness of 500–3000 Å.

6. The method of claim 1 wherein said Au layer is formed to a thickness of 2000–12000 Å.

7. The method of claim 1 wherein said n-type layer and said p-type layer of said semiconductor layered structure are each formed to a thickness of 10–100 μm.

8. The method of claim 1 wherein said n-type layer and said p-type layer of said semiconductor layered structure are each made to have carrier concentration in the range of $5 \times 10^{17} - 5 \times 10^{18}$ cm$^{-3}$.

9. The method of claim 1 wherein said surface-roughening process is carried out by means of a solution of hydrochloric acid with concentration at 10–35 weight %.

10. The method of claim 1 wherein said contact metal layer consists of one or more contact metal materials selected from the group consisting of alloys of Au with Be, alloys of Au with Zn and alloy of Au with Ni.

11. The method of claim 10 wherein said surface-roughening process is carried out to obtain surface roughness of 0.1–3 μm in terms of height difference between protrusions and indentations on said externally exposed portions.

12. The method of claim 10 wherein said top electrodes are formed by vacuum vapor deposition.

13. The method of claim 10 wherein said Mo layer is formed to a thickness of 100–3000 Å.

14. The method of claim 10 wherein said contact metal layer comprises an alloy of Au, having a thickness of 500–3000 Å.

15. The method of claim 10 wherein said Au layer is formed to a thickness of 2000–12000 Å.

16. The method of claim 10 wherein said n-type layer and said p-type layer of said semiconductor layered structure are each formed to a thickness of 10–100 μm.

17. The method of claim 10 wherein said ntype layer and said p-type layer of said semiconductor layered structure are each made to have carrier concentration in the range of $5 \times 10^{17} - 5 \times 10^{18}$ cm$^{-3}$.

18. The method of claim 10 wherein said surface-roughening process is carried out by means of a solution of hydrochloric acid with concentration at 10–35 weight %.

* * * * *